United States Patent [19]
Piccone

[11] Patent Number: 5,825,090
[45] Date of Patent: Oct. 20, 1998

[54] HIGH POWER SEMICONDUCTOR DEVICE AND METHOD OF MAKING SAME

[75] Inventor: Dante E. Piccone, Glenmoore, Pa.

[73] Assignee: Silicon Power Corporation, Malvern, Pa.

[21] Appl. No.: 554,600

[22] Filed: Nov. 6, 1995

Related U.S. Application Data

[63] Continuation-in-part of Ser. No. 280,989, Jul. 27, 1994, abandoned.

[51] Int. Cl.$^6$ ..................................................... H01L 23/48
[52] U.S. Cl. ........................ 257/747; 257/754; 257/757; 257/763; 257/769; 438/457; 438/715
[58] Field of Search ..................................... 257/689, 700, 257/688, 181, 508, 734, 750, 747, 754, 757, 763, 768, 769; 438/118, 122, 457, 597, 685, 765

[56] References Cited

U.S. PATENT DOCUMENTS

| | | | |
|---|---|---|---|
| 3,532,942 | 10/1970 | Boyer | 257/689 |
| 3,890,637 | 6/1975 | Yamamoto | 257/689 |
| 4,826,787 | 5/1989 | Muto et al. | 437/108 |
| 5,005,069 | 4/1991 | Wasmer et al. | 357/68 |
| 5,173,446 | 12/1992 | Asakawa et al. | 437/111 |
| 5,183,769 | 2/1993 | Rutter et al. | 437/684 |

FOREIGN PATENT DOCUMENTS

| | | | |
|---|---|---|---|
| 859945 | 12/1970 | Canada | 257/181 |
| 006541 | 3/1988 | Japan | 257/508 |

*Primary Examiner*—Peter Toby Brown
*Assistant Examiner*—Roy Potter
*Attorney, Agent, or Firm*—William Freedman

[57] ABSTRACT

This high-power semiconductor device comprises (a) a disk of refractory metal having flat faces at its opposite sides and (b) two wafers of a semiconductor material having a coefficient of expansion similar to that of the refractory metal, the wafers being alloyed to the faces of the refractory metal disk in substantially aligned relationship to each other to form an assembly of the wafer and the disk with alloyed joints between the wafers and the disk. The alloyed joints are formed at elevated temperatures, and the wafers are of such size and thickness that the tendency of the wafer at one side of the disk to cause bowing of the assembly upon cooling of the assembly following formation of the alloyed joints is counteracted by a substantially equal and opposite tendency of the wafer at the opposite side of the disk to produce a substantially equal and opposite amount of bowing of the assembly, thereby resulting in a substantially flat assembly of the wafers and the disk upon cooling of the assembly following formation of the alloyed joints.

The refractory metal disk is of tungsten or molybdenum, has a diameter of at least 1½ inches, and has a thickness of at least 5 mils and of such thickness value that if the wafer at one side of the disk were omitted so that a single wafer disk was present, the single wafer assembly would be subject to substantial bowing when it cooled following formation of the alloyed joint between the disk and the remaining wafer.

A method of making this device is also claimed.

25 Claims, 3 Drawing Sheets

HIGH POWER SEMICONDUCTOR DEVICE AND METHOD OF MAKING SAME

CROSS-REFERENCE TO RELATED APPLICATION

This application is a continuation-in-part of my application Ser. No. 08/280,989, filed Jul. 27, 1994 now abandoned.

TECHNICAL FIELD

This invention relates to a high power semiconductor device that comprises a wafer of semiconductor material brazed, or alloyed, to a substrate of refractory metal and also relates to a method of making such a semiconductor device.

BACKGROUND

In the typical high power semiconductor device of the above type, the semiconductor wafer is brazed, or alloyed, to one side only of a disk of refractory metal acting as a substrate for the wafer. The wafer is typically of silicon, and the refractory metal chosen for the substrate is one which has a coefficient of thermal expansion similar to that of the silicon, e.g., molybdenum or tungsten. The term "refractory metal" as used herein refers to a metal having a melting point of at least about 2500° C. Alloying is effected by first locating a thin layer of alloying, or brazing, material between appropriately metallized surfaces of the wafer and the substrate and then heating the resulting sandwich to a temperature that causes melting of the alloying material. Thereafter, the sandwich is allowed to cool, thus solidifying the alloying material and developing a bond between the wafer and the substrate. Before alloying, the wafer and the substrate are essentially flat, but because of an unavoidable difference in the coefficients of thermal expansion between the silicon and the refractory metal of the substrate, the alloyed-together sandwich, or assembly, develops a slight bow as it cools. More specifically, the refractory metal, having a slightly greater coefficient than the silicon, contracts, upon cooling, to a greater extent than the silicon; and this forces the assembly to bow in such a direction as to develop a concave surface on its exposed metal side and a convex surface on its exposed silicon side. An example of this type of semiconductor device is disclosed in U.S. Pat. No. 3,457,472—Mulski, where FIG. 3 illustrates the above-described bow that develops as the assembly cools following solidification of the alloyed joint.

The above-described bow is undesirable for a number of reasons. First of all, the tendency of the assembly to develop this bow has required that the substrate be relatively thick in order to reduce the bow to a manageable level; and the thicker the substrate, the more expensive it is. This extra expense can be quite substantial, especially where the substrate is of costly refractory metal and, especially also where the substrate comprises a large diameter disk. For example, disks having a diameter of 100 mm or even 125 mm may be present in today's high power semiconductor devices. Secondly, the bow interferes with obtaining good broad-area electrical and thermal contact at both faces of the assembly. One approach to dealing with this latter problem is to grind or lap the faces of the assembly into a smooth and flat configuration, but this is expensive and time-consuming. Another approach is to apply very high compressive forces to both faces of the assembly so as to flatten the assembly and provide for an interface of low electrical and thermal resistance between the assembly and conductive members pressed against these faces. Applying very high compressive forces requires that the conductive members be pressed together with exceptionally large bolts and springs, and this unduly increases the cost and size of the overall device. Still another reason why the bow is undesirable is that it interferes with the photo-etching process that is commonly used for producing a pattern of electrodes or other components on the face of the semiconductor device. Such process typically relies upon a flat mask which should seat flush against the face of the semiconductor device, but the bow interferes with achieving the desired flush seating of the mask.

OBJECTS

An object of my invention is to reduce the tendency of the assembly to bow as it cools following formation of the alloyed joint between the silicon wafer and the refractory metal disk substrate during an alloying operation.

Another object is to produce a substantially flat alloyed-together assembly of a semiconductor wafer and a refractory metal substrate in which the substrate is relatively thin.

Still another object is to provide an alloyed-together assembly of semiconductor wafer and refractory metal substrate in which substantial flatness is achieved without the need for lapping or grinding or other machining of the assembly faces.

Still another object is to provide an alloyed-together assembly of a semiconductor wafer and a thin refractory metal substrate that lends itself to being compressed between two conductive members that can be maintained in low electrical and thermal resistance relationship with the assembly even though relatively low compressive forces are applied through the conductive members and even though the faces of the assembly have not been machined to achieve flatness.

SUMMARY

In carrying out the invention in one form, I provide a method for making a high power semiconductor device comprising the following steps: (a) providing two wafers of semiconductor material and a flat disk of refractory metal, (b) providing an assembly that comprises said wafers, said disk sandwiched between said wafers, and alloying material located between each of said wafers and said disk, (c) heating said assembly to a temperature that causes said alloying material to melt, and (d) thereafter allowing said assembly to cool through the freezing point of the alloying material so as to effect an alloyed joint between each of said wafers and said disk. I utilize for this assembly wafers of semiconductor material that are of such size and thickness that the tendency of one of the wafers to cause bowing of the refractory metal disk upon cooling of the assembly following formation of the alloyed joints is counteracted by a substantially equal and opposite tendency of the semiconductor wafer at the opposite side of said disk to produce a substantially equal and opposite amount of bowing of the disk upon cooling following formation of the alloyed joints. This counteraction results in a substantially flat assembly of the wafers and the disk upon cooling of the assembly following formation of the alloyed joints.

I utilize for said refractory metal disk a disk of molybdenum or tungsten having a diameter of at least (38.1 mm) 1½ inches, a thickness of at least (0,127 mm) 5 mils and of such thickness value that if the wafer at one side of the disk were omitted so that a single-wafer assembly was present, the single-wafer assembly would be subject to substantial bowing when the single-wafer assembly cooled following formation of the alloyed joint between the disk and the remaining wafer.

In another form, the invention is carried out by providing a high-power semiconductor device that is made by the method of the two immediately-preceding paragraphs.

BRIEF DESCRIPTION OF FIGURES

For a better understanding of the invention, reference may be had to the following detailed description taken in conjunction with the accompanying drawings, wherein.

FURTHER DISCUSSION OF PRIOR ART

Figure 1:
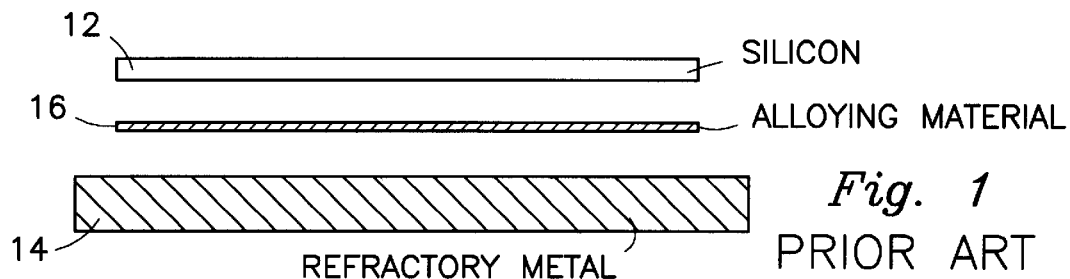
FIG. 1 is an exploded view of a prior art semiconductor device, shown schematically before its components are alloyed together.

Before describing various embodiments of my invention, I will describe a typical high power semiconductor device of the prior art. Referring to the exploded view of FIG. 1, this prior art semiconductor device is made from two basic components. One is a thin wafer 12 of semiconductor material such as silicon. The other is a disk 14 of a refractory metal such as molybdenum or tungsten that has a coefficient of thermal expansion similar to that of the silicon. Interposed between the wafer 12 and the substrate 14 is a thin layer 16 of alloying material (e.g., in the form of foil) which is utilized for brazing, or alloying, the wafer to the substrate in a manner soon to be described. A commonly used alloying material for this application is an aluminum-silicon alloy. Typically, these parts 12, 14, and 16 have circular peripheries. Before the alloying operation, the silicon wafer has flat upper and lower surfaces and, internally, has at least one broad-area PN rectifying junction substantially parallel to said upper and lower surfaces. Typically, the facing surfaces of the wafer and the substrate are appropriately metallized with very thin layers of metal that facilitate the formation of a good bond between the wafer and substrate during alloying.

Figure 2:
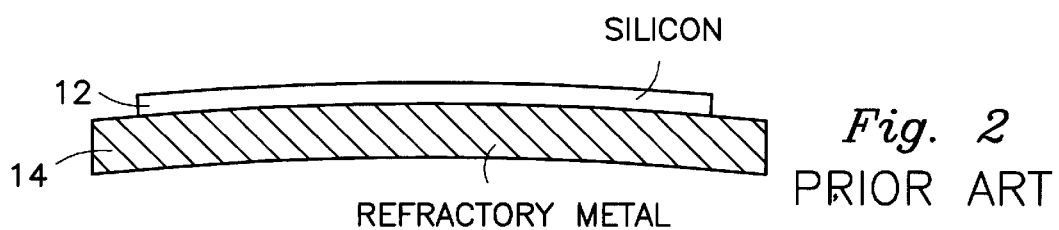
FIG. 2 is a schematic showing of the semiconductor device of FIG. 1 after its components have been alloyed together.

Alloying is effected by first bringing together the wafer and the substrate with the alloying layer 16 sandwiched between them and then heating the resulting sandwich in a brazing oven to a temperature sufficient to melt the alloying material. The sandwich is then allowed to cool, and this causes the alloying material, upon reaching its freezing temperature, to solidify and bond the wafer to the substrate. After the alloyed joint has thus been formed, further cooling of the assembly results in the substrate contracting by a slightly greater amount than the wafer due to the slightly greater coefficient of thermal expansion of the refractory metal compared to that of the silicon. This unequal contraction places the silicon under compression in a radial direction but also causes the assembly to bow slightly so that its final form is as shown in FIG. 2, with the bow shown somewhat exaggerated. In the alloyed-together assembly of FIG. 2, the exposed, or upper, face of the wafer 12 is convex, and the exposed, or lower, face of the substrate disk 14 is concave.

In typical single-wafer high-power assemblies such as shown in FIG. 2 and described in more detail in the table that appears hereinafter, the bow developed upon cooling of the assembly can be substantial, e.g., (0.038 mm) 1½ mils for a (38.1 mm) 1½ inch diameter substrate assembly and (0.051 to 0.076 mm) 2 to 3 mils for assemblies with substrates of (50.8 to 101.6 mm) 2 to 4 inches in diameter. This bow is the distance that the center of the exposed surface of the semiconductor wafer protrudes from its original location when the wafer was precisely flat.

DETAILED DESCRIPTION OF EMBODIMENTS

Figure 3:
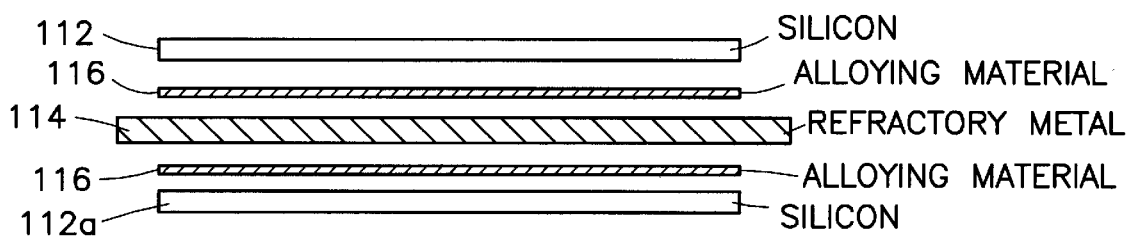
FIG. 3 is an exploded view of a semiconductor device embodying one form of my invention, shown schematically before its components are joined together.

The above-described bowing is undesirable for a variety of reasons, some of which are described hereinabove under "Background". My invention makes it possible to essentially eliminate this bowing and to obtain an essentially flat assembly. In one embodiment of the invention, illustrated in FIGS. 3 and 4, I provide instead of the single silicon wafer of FIGS. 1 and 2, two silicon wafers, one at each side of the substrate of refractory metal. These wafers (designated 112 and 112a) are substantially aligned, are of substantially the same thickness, and have substantially the same area alloyed to the refractory metal substrate 114. The same alloying material is used for alloying both wafers to the refractory metal substrate. Two layers 116 of this alloying material are shown in FIG. 3, on e between wafer 112 and the substrate 114 and one between wafer 112a and the substrate. These components are alloyed together by clamping them together in sandwich form and then heating the resulting sandwich to a temperature high enough to melt the alloying material. The sandwich is then allowed to cool, causing the alloying material, upon cooling to its freezing temperature, to solidify and bond the two aligned wafers to opposite sides of the substrate.

Figure 4:
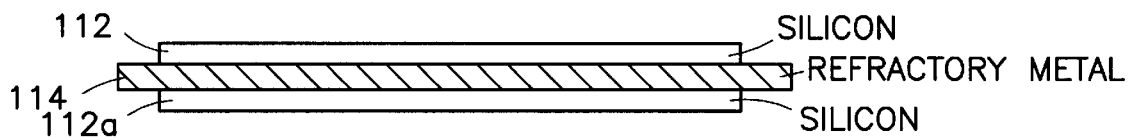
FIG. 4 is a schematic showing of the semiconductor device of FIG. 3 after its components have been joined together.

As the alloyed-together sandwich, or assembly, cools following formation of the alloyed joints, the upper silicon wafer 112, by contracting less than the metal substrate 114, tends to cause the assembly to bow into the configuration depicted in FIG. 2. But this tendency is counteracted by the tendency of the lower silicon wafer to cause the assembly to bow in an opposite direction. Because the lower wafer is substantially aligned with the upper wafer, is of the same material as the upper wafer, has substantially the same thickness as the upper wafer, and has substantially the same areas bonded to the substrate 114 as the upper wafer, the bowing force developed by the lower wafer is substantially equal to that developed by the upper wafer. Thus, the assembly is subject to substantially equal bowing forces acting in opposite directions. The net result is that the assembly remains substantially flat during and following cooling after formation of the alloyed joints. The alloyed-together flat assembly is depicted in FIG. 4.

By achieving such flatness, I can utilize a substrate of much less thickness than used in comparable prior art devices of the type depicted in FIGS. 1 and 2. For example, the device of FIGS. 1 and 2, assuming a substrate disk diameter of about (101.6 mm) 4 inches, would typically employ a disk thickness of (5.08 mm) 200 mils, whereas a comparable 4-inch device of the type shown in FIGS. 3–4 can employ a disk thickness of only (0.635 mm) 25 mils or even less. It will be apparent that this drastic reduction in disk thickness results in a significant cost reduction, especially when it is considered that the substrate disk is of costly refractory metal.

The following table provides additional examples of the reductions in substrate thickness made possible with this invention. Referring to the table, and assuming substrate diameters of the values specified in column 1, typical substrate thicknesses that the single-wafer devices of FIGS. 1 and 2 have employed are shown in column 2, and typical substrate thicknesses when employing the double-wafer assembly of FIGS. 3–4 are shown in column 3.

| (1) Substrate Diameter | (2) Substrate Thickness of Typical Single-Wafer Assembly of Prior Art | (3) Typical Substrate Thickness of Double-Wafer Assembly |
| --- | --- | --- |
| (38.1 mm) 1½" | (2.16 mm) 85 mils | (0.38 mm) 15 mils |
| (50.8 mm) 2" | (2.54 mm) 100 mils | (0.38 mm) 15 mils |
| (76.2 mm) 3" | (2.54 mm) 100 mils | (0.508 mm) 20 mils |
| (101.6 mm) 4" | (5.08 mm) 200 mils | (0.635 mm) 25 mils |

For the single-wafer assemblies referred to in the above table, the wafer, which is of silicon, had the following thicknesses: (0.36–0.89 mm) 14–35 mils for the 1½-inch substrate device; (0.33–1.91 mm) 13–75 mils for the 2-inch substrate device; (0.51–1.40 mm) 20–55 mils for the 3-inch substrate device; and (0.76–1.40 mm) 30–55 mils for the 4-inch substrate device. The substrate was of tungsten.

For double-wafer, high-power semiconductor devices having the substrate diameters shown in the above table, the substrate thickness can be less than the typical values disclosed in the table but should be at least (0.127 mm) 5mils. If the substrate thickness is substantially lower than this, the substrate does not ordinarily provide the desired mechanical protection for the semiconductor wafer. The substrate can be of either tungsten or molybdenum The flatness of my assembly also eliminates the need for expensive and time-consuming grinding or lapping operations which have often been used heretofore to eliminate, or reduce, the bow described in connection with FIG. 2.

Another approach that has been used heretofore to overcome the effects of bowing has been to apply very high compressive forces to opposite faces of the semiconductor device assembly so as to flatten the assembly. These forces are typically applied through conductive members bearing against opposite sides of the assembly and urged together by clamping bolts and spring washers, as is disclosed, for example, in the above-referred-to Mulski U.S. Pat. No. 3,457,472. While I may still use such conductive members for providing low resistance interfaces with the semiconductor assembly, the compressive forces urging the conductive members together can be substantially lower since they are not relied upon for flattening the already-flat semiconductor device assembly. This reduction in required force enables me to use smaller and less expensive bolts and spring washers for urging the conductive members together.

In the embodiment of FIG. 4, the wafers and the refractory metal disk have circular peripheries. It is to be understood, however, that the invention in its broader aspects is applicable to semiconductor devices comprising components having peripheries of other shapes.

Figure 5:
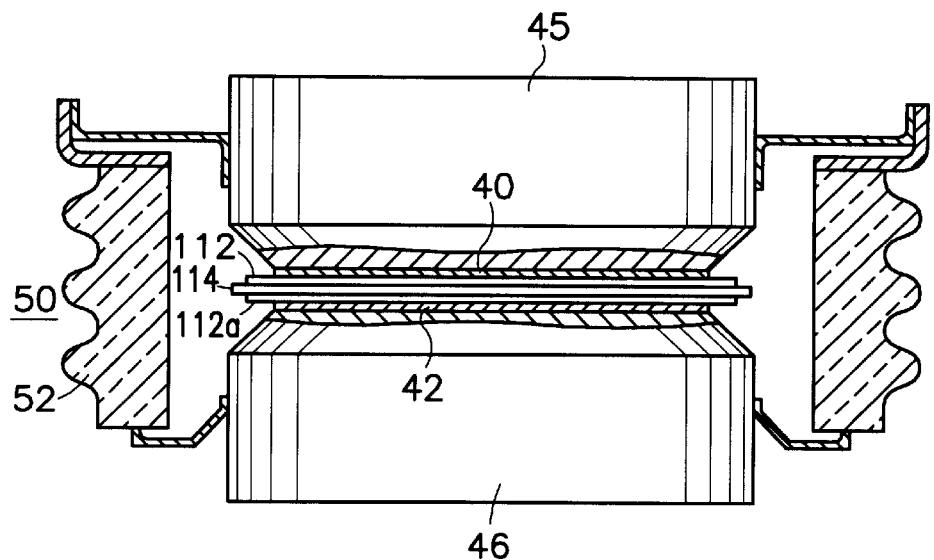
FIG. 5 is a side elevation view, partly in section, of an assembly that includes the semiconductor device of FIG. 4.

FIG. 5 is a simplified view partly in section of a typical assembly in which the semiconductor device of FIG. 4 might be used. In this assembly, the semiconductor device 112, 114, 112a is sandwiched between the inner ends of two conductive members 40 and 42 that are urged toward each other and against opposite faces of the semiconductor device. The conductive members 40 and 42, which are preferably of tungsten, are commonly referred to as strain buffers. Strain buffer 40 is located between the inner end of a conductive post 45 and the upper surface of the semiconductor device, and strain buffer 42 is located between the inner end of a conductive post 46 and the lower face of the semiconductor device. The forces for urging the conductive members toward each other are derived from clamping bolts and spring washers (not shown in this application) that are located outside the parts depicted in FIG. 5. The clamping bolts and spring washers develop forces that are applied to the posts 45 and 46 and urge them together. The above-referred-to Mulski U.S. Pat. No. 3,457,472 discloses a typical arrangement of such clamping bolts.

For protecting the semiconductor device 112, 114, 112a from the surrounding ambient, the assembly of FIG. 5 includes a sealed housing 50 in which the semiconductor device is located. This sealed housing comprises a generally cylindrical hollow cylinder 52 of insulating material surrounding in radially-spaced relationship the semiconductor device and those portions of the posts 45 and 46 located adjacent the semiconductor device. The housing further comprises the posts 45 and 46 themselves and flexible sealing means 54 and 56 at axially opposed ends of the insulating cylinder 52 for respectively forming seals between the posts 45 and 46 and the ends of the insulating cylinder 52. A housing of this type is shown in more detail in U.S. Pat. No. 4,099,211—Mueller.

The sealed housing is filled with a relatively inert gas, such as nitrogen, having a slight positive pressure with respect to the surrounding ambient, thus protecting the parts within the housing from oxidation and other types of chemical reaction, especially when at elevated temperatures.

When the semiconductor device is conducting, electric current flows through the assembly of FIG. 5 via a path that extends in series through the lower conductive post 46 and strain buffer 42, then through the semiconductor device 112a, 114, and 112, and then through strain buffer 40 and the upper conductive post 45. The strain buffers 40 and 42 and the posts 45 and 46 serve not only to carry electric current to and from the semiconductor device but also as thermal conductors which transfer heat away from the semiconductor device to opposite ends of the assembly and from there to suitable heat sinks (not shown) for transfer to the surrounding ambient.

Figure 6:
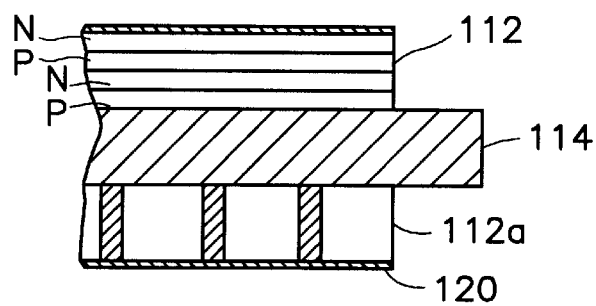
FIG. 6 is a sectional view of a portion of a modified form of my semiconductor device.

In one embodiment of the invention only one of the two silicon wafers, preferably the wafer 112, is an electrically active device, e.g., a diode or a thyristor. The other wafer 112a is an electrically inactive device, merely forming a low resistance conductive path between the lower surface of the semiconductor device and the substrate disk 114. One way of imparting this ability to act as a low resistance path to the lower wafer 112a is to construct the lower wafer of a low resistivity silicon. Another way of imparting this ability is to provide the lower wafer 112a with spaced-apart holes extending between its upper and lower faces, as is shown in FIG. 6. These holes are filled with low resistivity metal 116 that is capable of conducting current between a metal coating 120 on the lower face of the wafer and the refractory metal substrate 114 atop the lower wafer. The upper silicon wafer 112 is illustrated as a four layer thyristor having a metal coating 125 on its upper surface.

Figure 7:
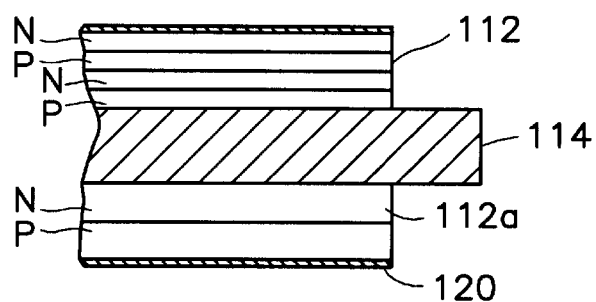
FIG. 7 is a sectional view of a portion of another modified form of my semiconductor device.

In another embodiment of the invention, both silicon wafers 112 and 112a are processed to serve as active electrical components. FIG. 7 illustrates one form of such a device. In this form of the device, the upper silicon wafer 112 has four layers of alternating N and P conductivity types and functions as an asymmetrical thyristor. The lower wafer has two layers, one of N type and the other of P type, and functions as a diode. The overall assembly 112, 114, 112a serves as a symmetrical thyristor with superior transient properties.

It is to be understood that the two silicon wafers can be processed in ways other than described in the two paragraphs immediately above to enable them to serve as other types of active electrical components, or, if desired, inactive electrical components. Generally speaking, irrespective of how the two wafers are processed to impart electrical characteristics to them, they can be bonded to the refractory substrate sandwiched between them by the alloying, or brazing, procedure described hereinabove.

Although, ideally, I totally eliminate the bow in the alloyed-together semiconductor device assembly, it is to be understood that my invention in its broader aspects comprehends the making of alloyed-together semiconductor device assemblies where the bow has been substantially reduced, although not totally eliminated, by using my above-described technique.

Figure 8:
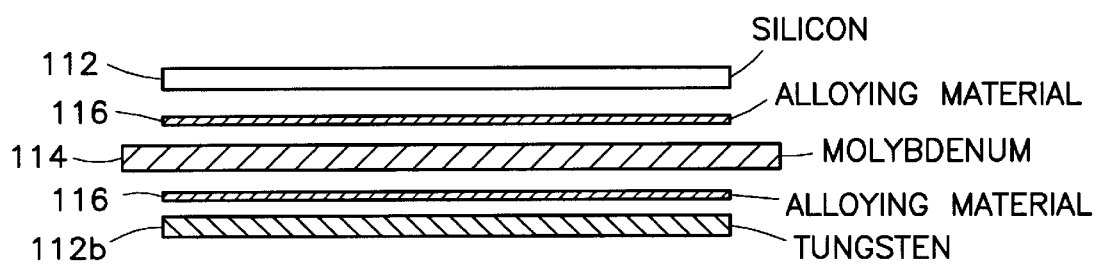
FIG. 8 is an exploded view of another modified form of semiconductor device embodying the invention, shown schematically before its components are joined together.
Figure 9:
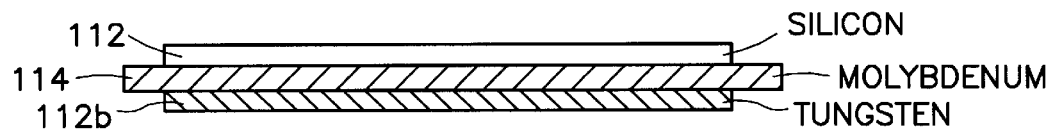
FIG. 9 is a schematic showing of the device of FIG. 8 after its components have been joined together.

FIGS. 8 and 9 illustrate another embodiment of the invention. This embodiment corresponds to that of FIGS. 3 and 4 except that the lower component, or wafer, instead of being of semiconductor material such as silicon, is of a refractory metal. The intermediate component 114 of FIGS. 8 and 9 is preferably of molybdenum, but the lower component, or wafer, 112b is preferably of tungsten. Tungsten has a coefficient of thermal expansion slightly lower than that of molybdenum, and cooling of the tungsten following bonding to the molybdenum substrate will produce a bowing force on the molybdenum substrate that acts in opposition to that produced by cooling of the silicon wafer at the opposite face of the molybdenum substrate. The magnitude of the bowing force produced by cooling of the tungsten can be controlled by selecting an appropriate thickness for the tungsten wafer. In one form of this embodiment, I select a thickness for the tungsten of such a value that the bowing force developed thereby is substantially equal to that developed by the silicon, thereby resulting in a substantially flat device, as shown in FIG. 9, after cooling of the device following formation of the alloyed joints between the components.

A disadvantage of the embodiment of FIGS. 8 and 9 compared to that of FIGS. 3 and 4 is that the tungsten used for the lower component is much more expensive than the silicon used for this purpose in FIGS. 3 and 4. An advantage is that tungsten has a higher conductivity than silicon, and this obviates the need for providing holes therethrough filled with highly conductive metal, as in the FIG. 6 embodiment.

While I have shown and described particular embodiments of my invention, it will be apparent to those skilled in the art that various other changes and modifications may be made without departing from the invention in its broader aspects. I, therefore, intend in the appended claims to cover all such changes that fall within the true spirit and scope of my invention.

What I claim is:

1. A method of making a high power semiconductor device, comprising the following steps:

(a) providing two wafers of semiconductor material and a flat disk of a refractory metal having a coefficient of thermal expansion similar to that of said semiconductor material, (b) providing an assembly that comprises said wafers, said disk sandwiched between said wafers, and alloying material located between each of said wafers and said disk, (c) heating said assembly sufficiently to cause said alloying material to melt, and thereafter allowing said assembly to cool so as to effect an alloyed joint between each of said wafers and said disk, (d) utilizing for said assembly wafers of semiconductor material of such size and thickness that the tendency of the semiconductor wafer at one side of the disk to cause bowing of the assembly upon cooling of the assembly following formation of the alloyed joints is counteracted by a substantially equal and opposite tendency of the semiconductor wafer at the opposite side of said disk to produce a substantially equal and opposite amount of bowing of the assembly upon cooling following formation of the alloyed joints, thereby resulting in a substantially flat assembly of said wafers and said disk upon cooling of the assembly following formation of said alloyed joints, and (e) utilizing for said refractory metal disk a disk of tungsten or molybdenum having a diameter of at least (38.1 mm) 1½ inches and a thickness of at least (0.127 mm) 5 mils and of such thickness value that if the wafer at one side of said disk were omitted so that a single-wafer assembly was present, the single-wafer assembly would be subject to substantial bowing when the single-wafer assembly cooled following formation of the alloyed joint between the disk and the remaining wafer.

2. The method of claim 1 in which the wafers of semiconductor material utilized at each side of the refractory metal disk have substantially equal thicknesses, have substantially equal areas alloyed to the disk of refractory metal, and are substantially aligned.

3. The method of claim 2 in which the two wafers are of essentially the same semiconductor material, and said alloying material used in each alloyed joint is essentially the same.

4. The method of claim 1 in combination with the additional step of introducing impurities into one of the wafers of semiconductor material to provide a plurality of layers of different conductivity types within said one wafer.

5. The method of claim 1 in combination with the additional step of introducing impurities into both of said semiconductor wafers to provide a plurality of layers of different conductivity types in each wafer.

6. The method of claim 4 in which the other of said wafers is provided with holes extending therethrough and conductive metal within said holes providing low-resistivity paths through said other wafer.

7. The method of claim 4 in which the other of said wafers has two faces at its opposite sides, one face being brazed to said disk and the other face having a metal coating thereon, and said other wafer is provided with holes extending between its two faces and conductive metal extending through said holes from said metal coating to the region of said refractory metal disk.

8. A high power semiconductor device comprising:

(a) a disk of refractory metal having flat faces at its opposite sides and (b) two wafers of a semiconductor material having a coefficient of thermal expansion similar to that of the refractory metal of said disk, said wafers being alloyed to said faces of the refractory metal disk in substantially aligned relationship to each other to form an assembly of said wafers and said disk with alloyed joints between said wafers and said disk, and in which:

(c) the alloyed joints between said wafers and said disk are formed at elevated temperature, (d) said wafers are of such size and thickness that the tendency of the wafer at one side of said disk to cause bowing of said assembly upon cooling of the assembly following formation of the alloyed joints is counteracted by a substantially equal and opposite tendency of the wafer at the opposite side of said disk to produce a substantially equal and opposite amount of bowing of the assembly, thereby resulting in a substantially flat assembly of said wafers and said disk upon cooling of the assembly following formation of said alloyed joints, (e) said refractory metal disk has a diameter of at least (38.1 mm) 1½ inches and a thickness of at least (0.127 mm) 5 mils and of such thickness value that if the wafer at one side of said disk were omitted so that a single-wafer assembly was present, the single-wafer assembly would be subject to substantial bowing when the single-wafer assembly cooled following formation of the alloyed joint between the disk and the remaining wafer, and (f) said refractory metal is tungsten or molybdenum.

9. The semiconductor device of claim 8 in which said wafers are of essentially the same semiconductor material and in which the material used for alloying one of said wafers to said disk is essentially the same as the material used for alloying the other of said wafers to said disk.

10. The semiconductor device of claim 8 in which one of said wafers contains impurities distributed therein in such a manner as to form a plurality of layers of different conductivity types in said one wafer with a junction between two of said layers.

11. The semiconductor device of claim 8 in which each of said wafers contains impurities distributed therein in such a manner as to form a plurality of layers of different conductivity types in each wafer with a junction between two of the layers in each wafer.

12. A high power semiconductor device comprising:

(a) a disk of refractory metal having flat faces at its opposite sides and (b) two wafers of a semiconductor material having a coefficient of thermal expansion similar to that of the refractory metal of said disk, said wafers being alloyed to said faces of the refractory metal disk in substantially aligned relationship to each other to form an assembly of said wafers and said disk with alloyed joints between said wafers and said disk, and in which:

(c) the alloyed joints between said wafers and said disk are formed at elevated temperature, (d) said wafers are of such size and thickness that the tendency of the wafer at one side of said disk to cause bowing of said assembly upon cooling of the assembly following formation of the allowed joints is counteracted by a substantially equal and opposite tendency of the wafer at the opposite side of said disk to produce a substantially equal and opposite amount of bowing of the assembly, thereby resulting in a substantially flat assembly of said wafers and said disk upon cooling of the assembly following formation of said alloyed joints, (e) one of said wafers contains impurities distributed therein in such a manner as to form a plurality of layers of different conductivity types in said one wafer with a junction between two of said layers, and (f) the other of said wafers contains holes extending therethrough and conductive metal within said holes providing low resistivity paths through said other wafer.

13. The semiconductor device of claim 12 in which the other of said wafers has two faces at its opposite sides, one face being alloyed to said refractory metal disk and the other having a metal coating thereon, and said holes extend between the two faces of said other wafer and said conductive metal extends through said holes from said metal coating to the region of said refractory metal disk.

14. The semiconductor device of claim 8 in which the wafers present at each side of said refractory metal disk have substantially equal thicknesses and have substantially equal areas alloyed to the refractory metal disk.

15. A method of making a high power semiconductor device, comprising the following steps:

(a) providing a first wafer of semiconductor material and a flat disk of refractory metal having a coefficient of thermal expansion slightly higher than that of said semiconductor material, (b) providing a second wafer of material that has a coefficient of thermal expansion lower than that of said refractory metal, (c) providing an assembly that comprises said wafers, said disk sandwiched between said wafers, and alloying material located between each of said wafers and said disk (d) heating said assembly to a temperature that causes said alloying material to melt, and thereafter allowing said assembly to cool so as to effect an alloyed joint between each of said wafers and said disk, (e) utilizing for said assembly wafers of such size and thickness that the tendency of the semiconductor wafer at one said of the disk to cause bowing of the assembly upon cooling of the assembly following formation of the alloyed joints is counteracted by a substantially equal and opposite tendency of the wafer at the opposite side of said disk to produce a substantially equal and opposite amount of bowing of the assembly upon cooling following formation of the alloyed joints, thereby resulting in a substantially flat assembly of said wafers and said disk upon cooling of the assembly following formation of said alloyed joints, and (f) utilizing for said refractory metal disk a disk of tungsten or molybdenum having a diameter of at least (38.1 mm) 1½ inches and a thickness of at least (0.127 mm) 5 mils and of such thickness value that if the wafer at one side of said disk were omitted so that a single-wafer assembly was present, the single-wafer assembly would be subject to substantial bowing when the single-wafer assembly cooled following formation of the alloyed joint between the disk and the remaining wafer.

16. The method of claim 15 in which said second wafer is of semiconductor material.

17. The method of claim 15 in which said first and second wafers are of essentially the same semiconductor material.

18. The method of claim 15 in which said second wafer is of a refractory metal that has a coefficient of thermal expansion closer to that of the semiconductor material than that of the refractory metal of said disk.

19. The method of claim 15 in which said second wafer is of a material consisting essentially of tungsten and said disk is of a material consisting essentially of molybdenum.

20. A high power semiconductor device comprising:
(a) a disk of refractory metal having flat faces at its opposite sides,
(b) a first wafer of a semiconductor material having a coefficient of thermal expansion slightly less than that of the refractory metal of said disk,
(c) a second wafer of a material having a coefficient of thermal expansion less than that of the refractory metal of said disk, and in which:
(d) said wafers are alloyed to said faces of said refractory metal disk in substantially aligned relationship to each other to form an assembly of said wafers and said disk with alloyed joints between said wafers and said disk,
(e) the alloyed joints between said wafers and said disk are formed at elevated temperature,
(f) said wafers are of such size and thickness that the tendency of the wafer at one side of said disk to cause bowing of said assembly upon cooling of the assembly following formation of the alloyed joints is counteracted by a substantially equal and opposite tendency of the wafer at the opposite side of said disk to produce a substantially equal and opposite amount of bowing of the assembly, thereby resulting in a substantially flat assembly of said wafers and said disk upon cooling of the assembly following formation of said alloyed joints,
(g) said refractory metal disk has a diameter of at least (38.1 mm) 1½ inches and a thickness of at least (0.127 mm) 5 mils and of such thickness value that if the wafer at one side of said disk were omitted so that a single-wafer assembly was present, the single-wafer assembly would be subject to substantial bowing when the single-wafer assembly cooled following formation of the alloyed joint between the disk and the remaining wafer, and
(h) said refractory metal is tungsten or molybdenum.

21. The device of claim 20 in which said second wafer is of semiconductor material.

22. The device of claim 20 in which said first and second wafers are of essentially the same semiconductor material.

23. A high power semiconductor device comprising:
(a) a disk of refractory metal having flat faces at its opposite sides,
(b) a first wafer of a semiconductor material having a coefficient of thermal expansion slightly less than that of the refractory metal of said disk,
(c) a second wafer of a material having a coefficient of thermal expansion less than that of the refractory metal of said disk, and in which:
(d) said wafers are alloyed to said faces of said refractory metal disk in substantially aligned relationship to each other to form an assembly of said wafers and said disk with alloyed joints between said wafers and said disk,
(e) the alloyed joints between said wafers and said disk are formed at elevated temperature,
(f) said wafers are of such size and thickness that the tendency of the wafer at one side of said disk to cause bowing of said assembly upon cooling of the assembly following formation of the alloyed joints is counteracted by a substantially equal and opposite tendency of the wafer at the opposite side of said disk to produce a substantially equal and opposite amount of bowing of the assembly, thereby resulting in a substantially flat assembly of said wafers and said disk upon cooling of the assembly following formation of said alloyed joints, and
(g) said second wafer is of a refractory metal that has a coefficient of thermal expansion closer to that of the semiconductor material than that of the refractory metal of said disk.

24. The device of claim 23 in which said second wafer is of a material consisting essentially of tungsten and said disk is of a material consisting essentially of molybdenum.

25. The device of claim 23 in which said refractory metal disk has a diameter of at least (38.1 mm) 1½ inches and a thickness of at least (0.127 mm) 5 mils and of such thickness value that if the wafer at one side of said disk were omitted so that a single-wafer assembly was present, the single wafer assembly would be subject to substantial bowing when the single-wafer assembly cooled following formation of the alloyed joint between the disk and the remaining wafer.

* * * * *